United States Patent [19]

Watanabe et al.

[11] Patent Number: 4,907,231
[45] Date of Patent: Mar. 6, 1990

[54] MEMORY CARTRIDGE-CONNECTABLE ELECTRONIC DEVICE SUCH AS ELECTRONIC STILL VIDEO CAMERA

[75] Inventors: Mikio Watanabe; Seiki Nishi, both of Tokyo, Japan

[73] Assignee: Fuji Photo Film Co., Ltd., Kanagawa, Japan

[21] Appl. No.: 191,064

[22] Filed: May 6, 1988

[30] Foreign Application Priority Data

| May 6, 1987 | [JP] | Japan | 62-108956 |
| May 19, 1987 | [JP] | Japan | 62-120075 |
| Jun. 23, 1987 | [JP] | Japan | 62-154459 |

[51] Int. Cl.$^4$ ............................................. G06F 11/10
[52] U.S. Cl. ..................................... 371/24; 371/21.2; 371/40.1
[58] Field of Search ................. 371/21, 68, 25, 53, 371/64, 9, 10, 11, 15, 24, 21.2, 21.2, 68.1, 68.3, 25.1, 66, 9.1, 10.1, 10.2, 10.3, 11.1, 11.3, 5.1, 40.1; 364/200, 900; 365/200, 201

[56] References Cited

U.S. PATENT DOCUMENTS

| 4,122,519 | 10/1978 | Bielawski | 364/200 |
| 4,122,520 | 10/1978 | Adamchick | 364/200 |
| 4,400,783 | 8/1983 | Locke | 364/900 |
| 4,414,665 | 11/1983 | Kimura | 365/201 |
| 4,488,300 | 12/1984 | Horey | 364/901 |
| 4,607,347 | 8/1986 | Kummer | 364/900 |
| 4,646,307 | 2/1987 | Nishimura | 371/21 |
| 4,727,544 | 2/1988 | Brunner | 371/25 |

FOREIGN PATENT DOCUMENTS

59183592 10/1984 Japan .

Primary Examiner—Michael R. Fleming
Assistant Examiner—Michael R. Fleming
Attorney, Agent, or Firm—Birch, Stewart, Kolash & Birch

[57] ABSTRACT

In a combination of an electronic device and a memory cartridge loaded in the device, a direct check is performed to determine if the device and memory cartridge are properly coupled. To this end, the electronic device writes a predetermined code in a predetermined area of a memory within the memory cartridge and subsequently reads the code out of the memory. Whether or not the coupling between the device and cartridge is normal is judged by comparing the written code and the read code. Alternatively the memory cartridge is provided with checking code generating means. A checking code generated by the generating means when the memory cartridge is loaded in the electronic device is checked on the electronic device side to judge whether the coupling is normal. An example of the electronic device is an electronic still video camera in which photography is enabled only when it is judged that the coupling between the camera and the memory cartridge is normal.

7 Claims, 8 Drawing Sheets

MEMORY CARTRIDGE-CONNECTABLE ELECTRONIC DEVICE SUCH AS ELECTRONIC STILL VIDEO CAMERA

BACKGROUND OF THE INVENTION

This invention relates to an electronic device, such as an electronic still video camera, which, on the basis of a physical signal (such as an electric signal, magnetic signal or optical signal), is capable of being coupled to a memory cartridge when the cartridge is loaded in the device at a predetermined location thereof. The electronic still video camera mentioned here refers to a camera which stores a video signal representing a still picture in a memory device in the form of digital data.

Attempts have been made to develop IC cards, CPU cards and memory cards, which incorporate an internal semiconductor element such as an IC or a semiconductor device, for use in a wide variety of fields as a substitute for conventional magnetic cards, a substitute for external memories such as floppy discs, and as novel electronic media or control means. Some of these cards have been put into practical use. When such a card is loaded in a prescribed location of an automatic machine, control device or other electronic device, the device and the card are rendered connectable by a physical signal, such as an electric signal, magnetic signal or optical signal. More specifically, connection terminals on the card can be connected to a connector on the side of the electronic device, or coupling can be achieved magnetically or optically. Under these conditions, the electronic device and the card can communicate with each other and the electronic device can execute card processing, such as writing data in the memory of the card.

In general, an IC card, a CPU card and a memory card are physically handled and, as a result, the connection terminals tend to pick up grease, dust and other foreign matter, which can lead to a poor connection. When the connection terminals do not make good contact with the connector of the electronic device, the aforementioned card processing cannot take place normally. In other words, a faulty connection can cause errors to appear in the communications between the electronic device and the card and can make it impossible to write data into the memory of card correctly.

One conceivable application of a memory card having a comparatively large-capacity memory is as a medium for storing image data picked up by a digital electronic still video camera. Since a camera of this kind can be used outdoors as well as indoors, the connection terminals of the memory card easily pick up moisture and therefore tend to oxidize and corrode. This is a cause of faulty connections, which can make correct recording of video data impossible. A memory card provided with a very large memory capacity will predictably have a large number of connection terminals. Since reliable recording cannot be expected even if only one of these terminals develops a faulty connection, there is greater risk of recording failure.

The adherence of dust or other contaminants can lead to a faulty connection not only in instances where coupling depends upon the electrical contact between the connection terminals of the card and the connector of the electronic device but also in cases where coupling is achieved magnetically or optically.

Correct card processing also cannot be expected if the loading (as by insertion) of the card into the electronic device is not performed in the proper manner.

The special circumstances concerning an electronic still video camera will now be described in detail.

An electronic still video camera described in the specification of Japanese Patent Application Laid-Open (KOKAI) No. 59-183592 includes a camera body having an imaging optical system and a solid-state image pick-up device and is connected to a loadable/unloadable memory which stores, in the form of a digital signal, a video signal representing a still picture imaged by the image pick-up device. The memory storing the video signal is removed from the camera and loaded in a playback apparatus. The playback apparatus reads the video signal out of the memory and reproduces the video signal as a visible picture on the screen of a video monitor.

When photography is performed using an electronic still video camera of this type, it is necessary to load the memory in the camera accurately in order to connect the memory to the camera circuit-wise, after which photography is performed to produce a video signal which is then stored in the memory. However, since the electrical circuit-wise connection of the memory cannot be detected in this conventional electronic still video camera, it is impossible for the operator to know at the time that the memory is loaded whether the memory has actually been connected to the camera in terms of the electrical circuitry. If the connection has not been made, therefore, a video signal will not be stored in the memory even if the photographer takes a picture of a subject. This means that the photographer will have wasted his time since the picture which should have been taken will not be recorded.

Furthermore, in spite of the fact that the video signal is not being stored in the memory, the electronic still video camera will nevertheless image the subject being shot, convert the resulting video signal into a digital signal, create color separation information, optical distortion information and various types of data necessary for playback on a playback apparatus, and deliver these signals and data to connection means. Power is thus consumed wastefully.

SUMMARY OF THE INVENTION

An object of the present invention is to make it possible to check the coupling between an electronic device and e.g. an IC card, a CPU card having a memory, a memory card or a semiconductor memory module (referred to generally as "memory cartridges") by comparatively simple processing.

Another object of the present invention is to provide a dignal electronic still video camera capable of performing photographic operations only after a memory cartridge has been positively connected to the camera and video signals are capable of being recorded.

The present invention provides an electronic device which, when a memory cartridge having a memory is loaded in the electronic device, is capable of coupling with the memory cartridge based on a physical signal, the electronic device comprising first sensing means for sensing that the memory cartridge has been loaded at a prescribed location in the electronic device, writing means for designating a predetermined address in the memory of the memory cartridge and writing a predetermined code at the predetermined address when loading of the memory cartridge has been sensed by the first sensing means, reading means for reading the code written by the writing means out of the memory, and second sensing means for sensing coincidence between the code written by the writing means and the code read by the reading means.

When coincidence is not sensed, this means that coupling is faulty. In a preferred embodiment, therefore, means are provided for outputting a warning signal when coincidence is not sensed.

In a preferred embodiment, the aforementioned writing, reading and coincidence sensing processing is executed a number of times changing the address or the code or both.

The memory cartridge refers to an arrangement in which the memory is housed in a case such as a card-shaped case or box-shaped case, as well as to a semiconductor memory module. It goes without saying that the concept of a memory cartridge covers not only one having a CPU and a memory and one further including a liquid crystal display device and a keyboard, but also one having only a memory and no CPU or one having a required power supply and some other circuitry in addition to a memory. Furthermore, as mentioned above, the type of coupling between the memory cartridge and the electronic device includes not only electrical contact between the connection terminals of the memory cartridge and the connector of the electronic device but also optical coupling, which comprises one or a plurality of light-projecting elements provided on one of the memory cartridge and electronic device and one or a plurality of light-receiving elements provided on the other of the memory cartridge and electronic device, and magnetic coupling, comprising coil means or the like.

In accordance with the invention, a predetermined code from the electronic device is transmitted to the memory cartridge through the aforementioned physical coupling and the code is written in the memory. The code that has been written in the memory is read by the electronic device, and it is determined whether the read code coincides with the written code. If coincidence is detected, then a decision is rendered that the physical coupling is normal. If coincidence is not detected, however, the decision rendered is that the physical coupling is abnormal.

Thus, processing for determining whether or not the memory cartridge and electronic device are coupled normally can be performed after a comparatively short period of time and in a comparatively simple manner.

A device for checking the state of coupling between a memory cartridge and an electronic device in accordance with the invention comprises a memory cartridge having a memory and first coupling means, and an electronic device having a second coupling means, wherein when the memory cartridge is loaded in the electronic device, the electronic device is capable of being coupled with the memory cartridge through the first and second coupling means on the basis of a physical signal.

The memory cartridge is provided with means for generating a checking code, and changeover means for changing over a connection between the first coupling means and the memory or the checking code generating means.

One of the memory cartridge and the electronic device is provided with means for sensing that the memory cartridge has been loaded in the electronic device at a predetermined location thereof, and control means for controlling the changeover means in such a manner that the checking code generating means is connected to the first coupling means when loading of the memory cartridge in the electronic device has been sensed.

The electronic device is provided with means for examining the checking code transmitted by the checking code generating means via the first and second coupling means, and for determining whether coupling performed by the first and second coupling means normal or abnormal.

In accordance with the invention, when the memory cartridge is loaded in the electronic device, the predetermined code generated in the memory cartridge is transferred to the electronic device through the first and second coupling means, and the electronic device examines the code to determine if it is the predetermined one. If this is determined to be the fact, the electronic device decides that the coupling between it and the memory cartridge is normal. If non-coincidence is detected, the electronic device decides that the coupling is abnormal.

Thus, processing for determining whether or not the memory cartridge and electronic device are coupled normally can be performed after a comparatively short period of time and in a comparatively simple manner.

Further, in accordance with the invention, there is provided a digital electronic still video camera to which a memory cartridge is connected in a loadable/unloadable manner, the memory cartridge storing, in the form of digital data, a video signal representing a still picture, the camera comprising: connecting means to which the memory cartridge is connected circuit-wise in a loadable/unloadable manner; image pick-up means having a solid-state image pick-up device and adapted to image a subject by the solid-state image pick-up device and output a video signal representing the subject; signal converting means for converting the video signal outputted by the image pick-up means into a corresponding digital signal and outputting the digital signal to the connecting means; and control means for controlling the image pick-up means and signal converting means to cause the image pick-up means to perform imaging and cause the signal converting means to convert the outputted video signal into a digital signal, and for supplying the connecting means with a control signal for controlling writing into the memory cartridge; the control means including information generating means for generating information for verifying that the memory cartridge has been connected to the camera electrical circuit-wise by the connecting means, and information verifying means for verifying the information generated; wherein when the memory cartridge is loaded in the camera, the control means sends the information generated by the information generating means to the memory cartridge, and enables each functional part of the camera to perform a photographic operation after the information verifying means verifies that the information has been stored in the memory cartridge.

Thus, in accordance with the invention, power is not supplied when loading of the memory cartridge is not sensed. This makes it possible to prevent photographic errors due to a faulty connection between the memory cartridge and the camera. Furthermore, a code for checking the connection to the memory cartridge is written in the memory, and photography is made possible after sensing that this information has been written in the memory. This prevents the occurrence of a situation in which a video signal cannot be recorded in the memory. Wasteful consumption of power can therefore be avoided.

Since photography is made possible only after information necessary for playback is written in the memory beforehand, it is possible to avoid a situation in which the information necessary for playback is not stored in the memory.

DESCRIPTION OF THE PREFERRED EMBODIMENTS

Figure 1:
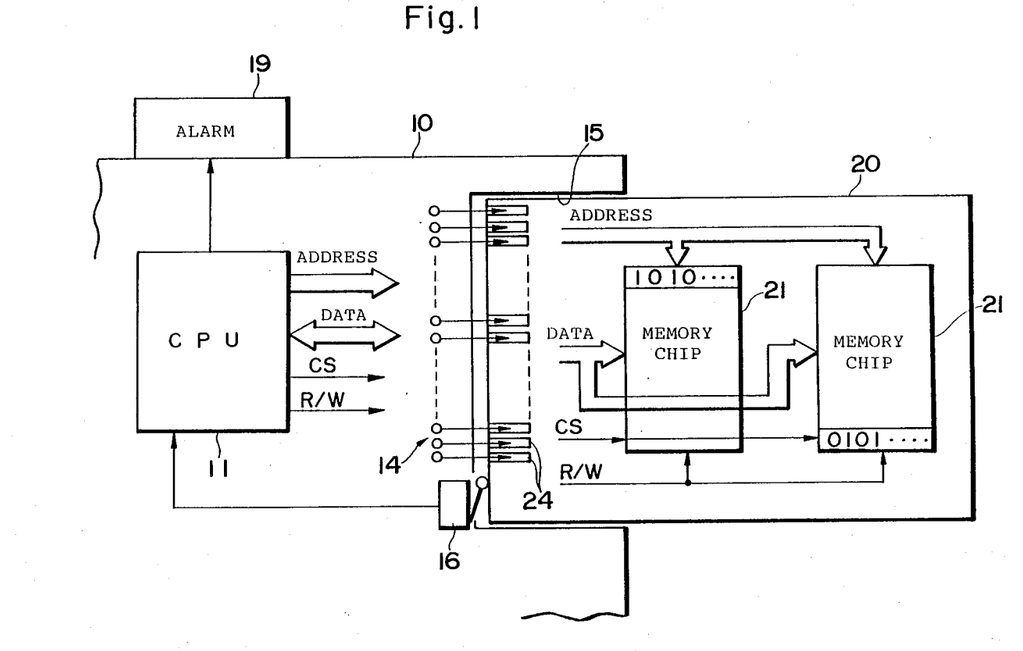
FIG. 1 illustrates an embodiment of the present invention and shows the state of a connection between an electronic device and a memory cartridge, as well as the electrical construction of the device and cartridge.

FIG. 1 illustrates the state of a connection between an electronic control device 10 and a memory cartridge 20.

Figure 3:
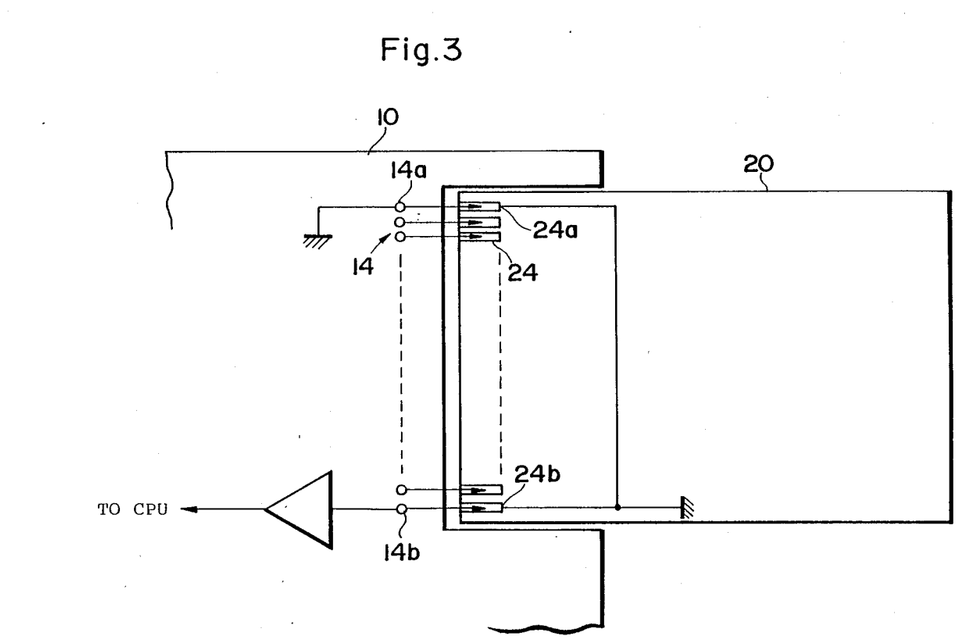
FIG. 3 is a view showing another example of sensing loading of a memory cartridge.

The electronic device 10 is a device, such as a digital electronic still video camera, which requires the memory cartridge 20 as a medium for storing desired data. The electronic device 10 is provided with a recess or guide 15 in which the memory cartridge 20 is loaded, as by being inserted. The portion of the memory cartridge 20 that is inserted into the recess 15 is formed to have a number of connection terminals 24. Provided in the recess 15 of the electronic device 10 is a connector 14 having terminals equivalent in number to the terminals 24 for electrically contacting these terminals when the memory cartridge 20 is loaded. Also disposed in the recess 15 is a limit switch 16 for sensing that the memory cartridge 20 has been loaded in the recess 15 in proper fashion. The limit switch 16 produces a detection signal applied to a CPU 11. It is possible to sense the loading of the memory cartridge 20 by any of a variety of sensors, such as a photoelectric switch for sensing loading optically, or a switch for sensing loading magnetically. It is possible to sense loading of the memory cartridge 20 by electrical sensing means such as shown in FIG. 3. One terminal 14a of the connector 14 of electronic device 10 is connected to the ground of the electronic device, and one other terminal 14b of the connector 14 is connected to the CPU 11 through an amplifier if necessary. Terminals 24a, 24b of the memory cartridge 20 that are to be connected to respective ones of the terminals 14a, 14b are connected to each other and to the ground of the memory cartridge. When the memory cartridge 20 is loaded in the electronic device 10, ground-level signals are applied to the CPU 11 through the terminals 14a, 24a, 24b, 14b. The CPU 11 is thus capable of sensing that the memory cartridge 20 has been loaded.

The electronic device 10 is provided with the abovementioned CPU 11, which controls various operations in the electronic device and executes processing, described below, to check the connection of the memory cartridge. The electronic device 10 is also provided with an alarm device 19, such as a buzzer or light-emitting diode, which informs an operator of the fact that the checked connection has been determined to be faulty when such a determination is made. The alarm device 19 is connected to the CPU 11.

The memory cartridge 11 has several internal memory chips 21. If volatile, these memories incorporate a power supply such as a battery.

Some of the terminals of connector 14 and the corresponding connection terminals 24 of memory cartridge 20 are for transmitting an address signal used to address the memory in the memory cartridge 20. Some of the other of these terminals are for transferring data. Furthermore, one or a plurality of the terminals is for transmitting a chip-select signal CS, and one or a plurality is a terminal for a read/write command R/W from the CPU 11. These terminals in connector 14 are connected to the CPU 11 by an address bus, data bus and control lines for the signals CS, R/W. The terminals 24 of memory cartridge 20 are also connected to respective ones of the address bus, data bus and control lines connected to the memory chips 21. Accordingly, when the memory cartridge 20 is loaded in the electronic device 10, the address bus, data bus and control lines inside the electronic device 10 are connected to the corresponding buses and lines in the memory cartridge 20 via the connector 14 and terminals 24, and it becomes possible for the CPU 11 of electronic device 10 to directly access the memory of the memory cartridge 20.

Depending upon the particular case, a connection terminal is also provided in order to connect a power supply line for the purpose of supplying the memory cartridge 20 with electric power from the electronic device 10.

Figure 2:
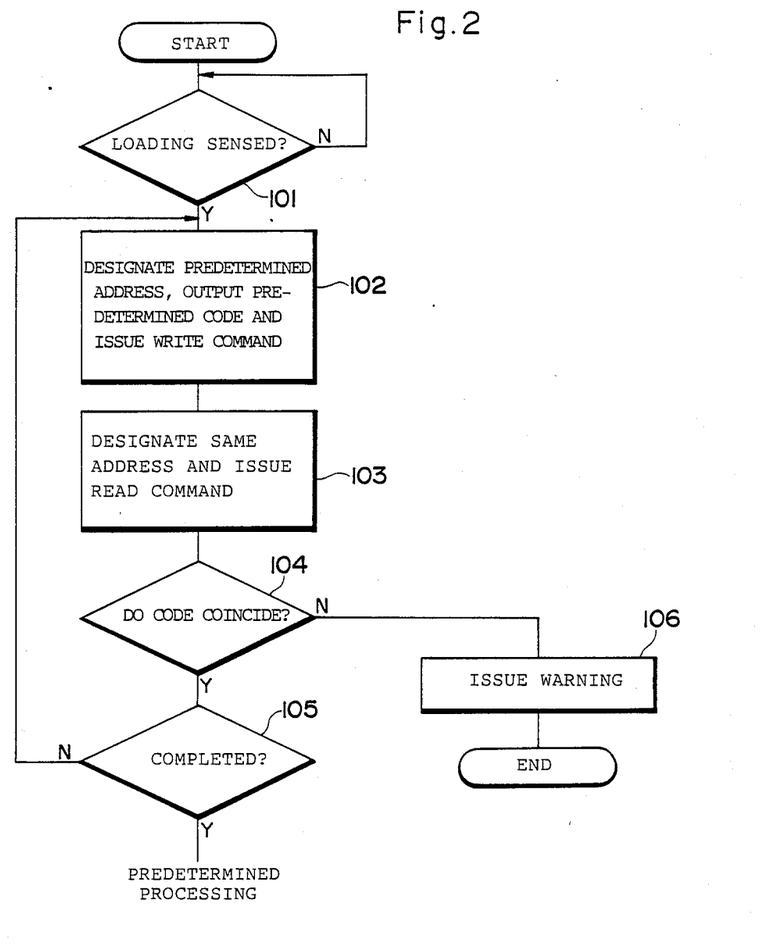
FIG. 2 is a flowchart illustrating a connection checking processing procedure.

FIG. 2 shows the general features of a connection checking processing executed by the CPU 11.

When the limit switch 16 issues a detection signal indicating that the memory cartridge 20 has been loaded at step 101, the CPU 11 outputs an address signal, which designates a predetermined address of the memory in memory cartridge 20, as well as the chip select signal, sends a predetermined code out on the data bus, and outputs a write command (step 102). As a result, the abovementioned code is written in the designated storage location of the memory in memory cartridge 20. Next, the CPU 11 outputs an address signal designating the same address as mentioned above, a chip-select signal and a read command, and reads the previously written code out of the same storage location through the data bus (step 103). The CPU 11 compares the code that was transmitted for the purpose of being written and the code read in response to the read command, and determines whether the two codes coincide (step 104). If the two codes coincide, the same processing is repeated upon altering at least the address or the code data (step 105). When writing, reading and comparing processing regarding combinations of given addresses and codes ends, connection checking processing is terminated and the program proceeds to predetermined processing relating to the memory cartridge 20, e.g. to processing for writing video data in a predetermined memory area. If the two codes are found not to coincide at the step 104, a command is applied to the alarm device 19, which responds by issuing an alarm indicative of non-coincidence (step 106).

By way of example, in the first cycle of processing, a signal composed of all 0's (i.e. a signal in which all bits are zero) is applied as an address signal (inclusive of the chip-select signal), and data in which 1 and 0 repeat alternatingly starting from 1, as in the manner 1010 . . . , is applied as a code. The checking processing of steps 102 through 104 is executed based on this address signal and code. In the second cycle of processing, an address signal composed of all 1's and data 0101 . . . , in which the code is reversed, are applied and the processing of steps 102 through 104 is executed in the same manner. By adopting such an arrangement, 1 and 0 signals are transmitted through all terminals of connector 14 and all of the corresponding connection terminals 24 in at least two processing cycles. Accordingly, if a YES decision (coincidence) is rendered at the step 104 in each of these processing cycles, then this will mean that all of the terminals are in a satisfactorily connected state.

It goes without saying that the combinations of address signals and codes given by the CPU 11 can be selected at will.

If necessary, an arrangement can be adopted in which, when a NO answer is received at the step 104, thereby indicating that the connection is faulty, the program proceeds to warning processing only if a YES answer still is not received even after the processing for designating the same address, transmitting the same code and reading out the code is repeated a predetermined number of times. In a configuration having an automatic loading mechanism which loads the memory cartridge automatically, it can be arranged so that the memory cartridge is ejected once and then reloaded when a NO answer is received at the step 104.

Figure 4:
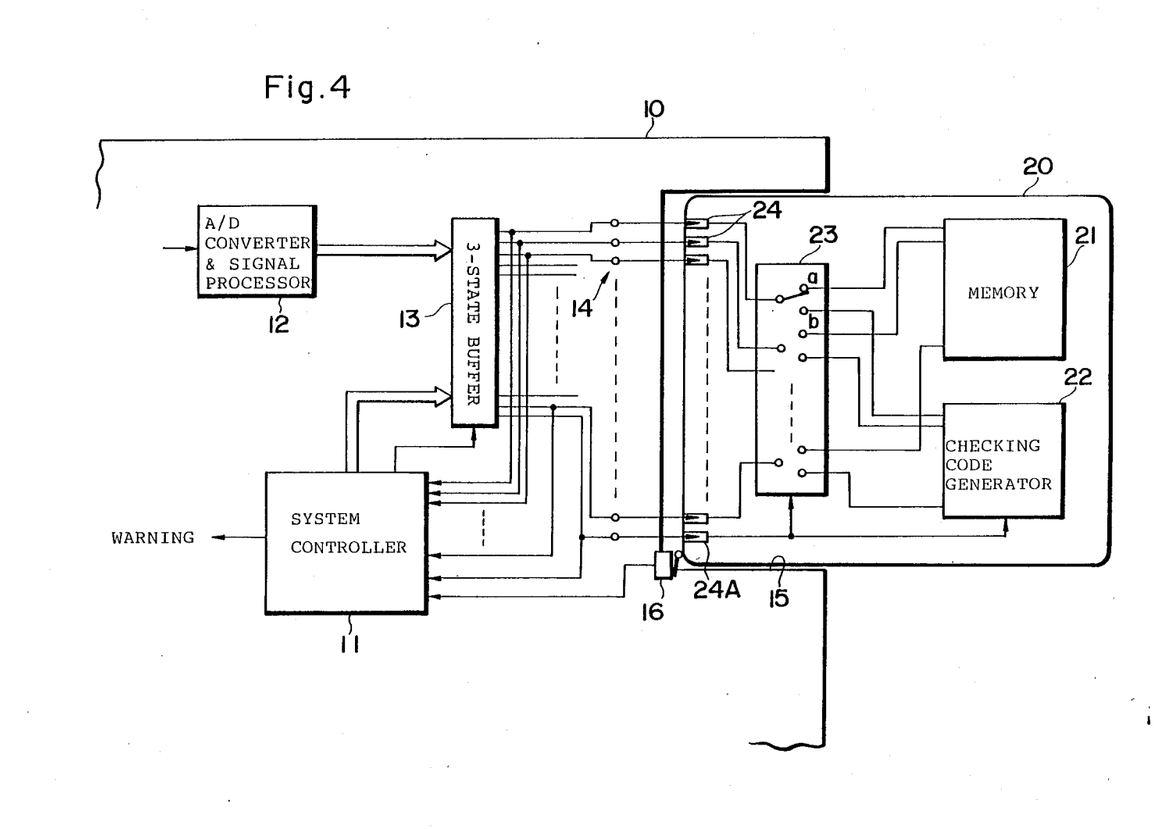
FIG. 4 illustrates another embodiment of the present invention and shows the state of a connection between an electronic device and a memory cartridge, as well as the electrical construction of the device and cartridge.

FIG. 4 illustrates another embodiment of the invention. Portions in FIG. 4 which are identical with those of FIG. 1 or which implement the same functions are designated by like reference characters and are not described again. In this embodiment, the electronic device 10 is provided with a system controller 11 including a CPU for controlling various operations of the electronic device 10 and executing processing to check the connection of the memory cartridge 20. An alarm device (not shown) is connected to the system controller 11 for informing an operator of the fact that the checked connection has been determined to be faulty when such a determination is made. If the electronic device 10 is a digital electronic still video camera, video data to be written in the memory 21 of the memory cartridge 20 is applied from an image pick-up device (not shown) to an A/D converting and signal processing circuit 12 in the form of an analog signal. The circuit 12 subjects the video to an A/D conversion and predetermined signal processing, thereby producing picture data applied to a three-state buffer 13 by the data bus. A three-state buffer is one which can establish a high output impedance in response to a control signal inputted thereto, with the signal obtained from the output side of the buffer at such time inhibiting an input to the buffer. A three-state buffer ordinarily has a low output impedence, with a signal applied to the input side thereof being introduced to the output signal intact. An address bus and a control bus from the system controller 11 are connected to the three-state buffer 13. The output side of the buffer is connected to the connector 14 and also to the system controller 11.

The memory cartridge 20 is provided with a memory 21 including one or a plurality of memory chips, a checking code generating circuit 22 for generating a predetermined checking code, a multiplexer 23 for changing over connection between the terminals 24 and the memory 21 or generating circuit 22, and a power supply (not shown), such as a battery, for supplying the generating circuit 22 with electric power. Normally, the multiplexer 23 connects the terminals 24 to the memory 21 (side a). Upon receiving a changeover control signal from a terminal 24A, the multiplexer 23 connects the output side of the checking code generating circuit 22 to the terminals 24 (side b) for a fixed period of time.

As mentioned earlier, some of the terminals of connector 14 and the corresponding connection terminals 24 of memory cartridge 20 are for transmitting an address signal used to address the memory of the memory cartridge 20. Some of the other of these terminals are for transferring data. Furthermore, there are terminals for transmitting a chip-select signal CS, a read/write command R/W and control signals such as the above-mentioned changeover control signal (terminal 24A). Accordingly, when the memory cartridge 20 is loaded in the electronic device 10, the address bus, data bus and control lines inside the electronic device 10 are connected to the corresponding buses and lines in the memory cartridge 20 via the connector 14 and terminals 24, and it becomes possible for the CPU of the system controller 11 in electronic device 10 to directly access the memory of the memory cartridge 20. Since a checking code is used in order to check the state of the connections between all of the terminals 24 and all of the terminals of connector 14, the checking code generated by the generating circuit 22 is applied to all of the terminals 24 (except for terminal 24A) via the multiplexer 23.

The general features of connection checking processing executed by the CPU of electronic device 10 will now be described.

When the limit switch 16 issues a detection signal indicating that the memory cartridge 20 has been loaded, the CPU of controller 11 outputs the changeover control signal. This signal is applied to the multiplexer 23 and checking code generating circuit 22 via the terminal 24A and the corresponding terminal of connector 14. Accordingly, the output side of the checking code generating circuit 22 is connected to the terminals 24 and the circuit 22 generates a predetermined checking code. At the same tim, the system controller 11 applies a control signal to the three-state buffer 13, whereby the output side thereof attains a high impedance. The checking code generated by the generating circuit 22 is applied to the system controller 11 through the multiplexer 23, terminals 24 and connector 14. Since the buffer 13 presents a high output impedance (a high input impedance with regard to the checking code), the checking code does not enter the buffer 13.

The CPU of the system controller 11 investigates the inputted checking code to determine whether it is a predetermined code. This can be achieved by previously storing a checking code in the controller 11, and having the controller 11 compare this code with the inputted checking code to determine if they coincide. Alternatively, if the checking code generated by the circuit 22 exhibits a certain regularity (e.g. 1's and 0's repeating in alternating fashion starting with 1, such as 1010 . . .), checking can be performed by investigating the code for this regularity. Preferably, it is arranged so that the generating circuit 22 successively generates two or more types of checking codes to transmit 1 and 0 signals through all of the terminals 24 and all of the terminals in the connector 14. If no abnormality is found as a result of investigating all of the checking codes, then the CPU stops outputting the changeover control signal to switch the multiplexer 23 over to the side of memory 21, and the circuit 22 stops generating the checking code. The program then proceeds to predetermined processing regarding the memory cartridge 20, such as processing for writing video data in a predetermined memory area. If even one bit is found to be erroneous as a result of investigating the checking code, a command is applied to the alarm device, which responds by issuing an alarm to this effect. Obviously, depending upon the particular case, an arrangement can be adopted in which an alarm is issued only if a decision indicative of a normal connection is not rendered after the checking processing is repeated a plurality of times.

It is permissible to adopt an arrangement in which, if the memory cartridge possesses a CPU, the checking code is generated by this CPU. An arrangement is also possible in which the memory cartridge is provided with a cartridge loading detection switch, and a CPU within the cartridge responds to loading detection by changing over the multiplexer 23 and starting generation of the checking code.

Furthermore, in the above-described arrangement shown in FIG. 3, a predetermined voltage can be applied to the terminal 14a, with the changeover of multiplexer 23 and the generation of the checking code being initiated by a voltage which will appear at the terminal 24a when the memory cartridge is loaded. In this case, the voltage impressed upon the terminal 24a would be sent to ground potential at the end of the checking operation. Alternatively, the cartridge could be provided with a timer for controlling the checking time period. When time runs out, the multiplexer would be returned to the memory side and the generation of the checking code would be terminated.

An embodiment of a digital electronic still video camera in accordance with the present invention will now be described. Portions identical or similar to those described above are designated by like reference characters.

Figure 5:
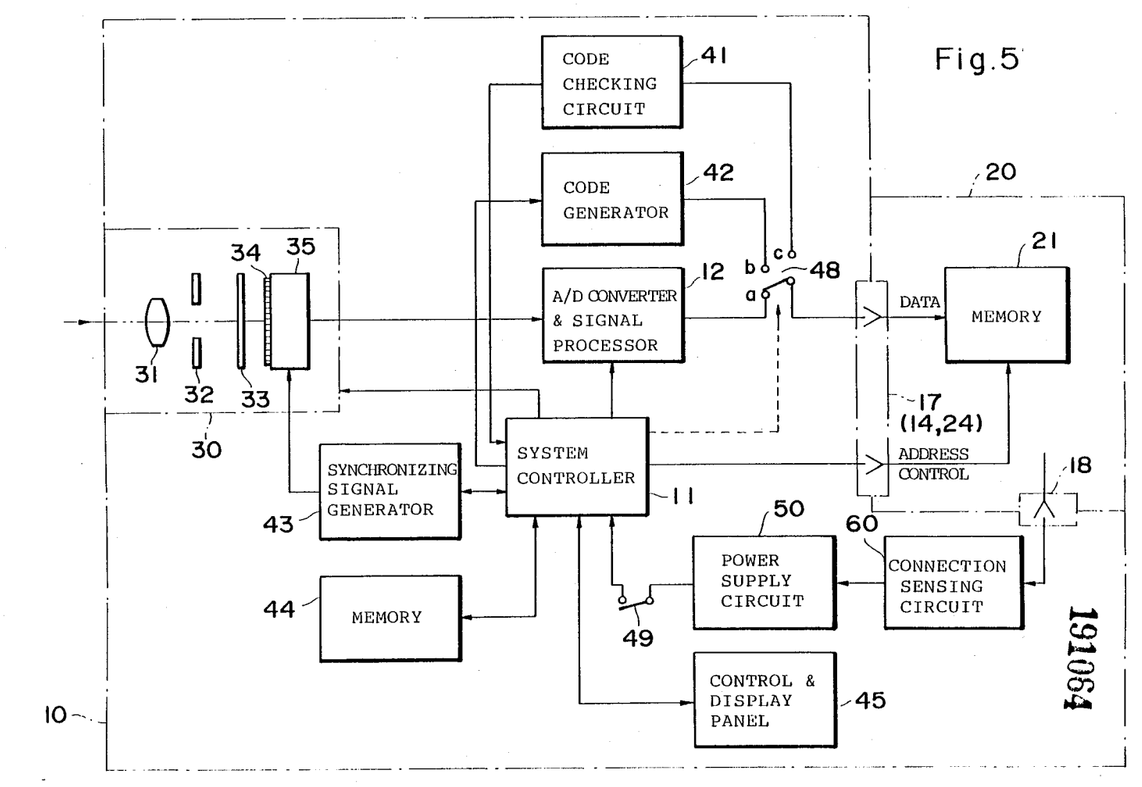
FIG. 5 is a functional block diagram illustrating yet another embodiment of the present invention and showing a digital electronic still video camera.

FIG. 5 illustrates an embodiment of a digital electronic still video camera in accordance with the present invention. The embodiment includes an electronic still video camera 10 having an image pick-up section 30, and a memory cartridge 20 connected to the camera 10 via a connector 17 in loadable/unloadable fashion. Conceptually, the connector 17 includes the above-described connector 14 and terminals 24. The connector 17 includes a connector portion 18, described below. The memory cartridge 20 includes, say, for example, SRAM semiconductor memory 21 and is connected to the camera 10 by its connector 17 via a data bus as well as address and control buses through which addresses, read/write enable signals, chip-select signals, strobes and clocks are passed. The connector 17 may have power feeder lines for the memory 21. If one frame of a picture is expressed by data of 1 M through 1.5 M bits, the memory 21 can be a 24-frame memory device realized by two chips, where the SRAM has a storage capacity of 16 M bits per chip. The image pick-up section 30 has a camera lens 31, a diaphragm 32, a shutter 33, an image pick-up device 35, and other elements necessary for taking still pictures, such as a photometer and range finder mechanisms, a view finder (not shown) and drive mechanisms for driving these elements. Focusing the lens 31, operating the diaphragm 32 and actuating the shutter 33, etc., are controlled by system controller 11. As will be described later, the system controller 11 operates the image pick-up section 30, such as the shutter 33, after verifying the electrical connection between the memory cartridge 20 and the camera 10.

A solid-state image pick-up device such as a CCD or MOS is employed advantageously as the image pick-up device 35. The solid-state image pick-up device 35 has an image pick-up cell array 34 to which a color filter is attached. In response to a clock signal received from a synchronizing signal generating circuit 43, the image pick-up device successively outputs a color-modulated video signal in the form of a dot (pixel) sequence. In the image pick-up device 35, any suitable array of photosensitive cells constituting the image pick-up cell array 34, namely any suitable number of pixels of the photosensitive region, can be used. Also, the array of color segments of the color filter can be of any type.

The video signal output of the image pick-up device 35 is applied to the analog-digital converting and signal processing circuit 12. As mentioned above, the circuit 12 converts the analog input video signal into the corresponding digital data of e.g. eight bits and outputs the resulting digital signal to the connector 17 via a changeover switch circuit 48 (terminal a). The digital data is finally applied to the data bus of the memory cartridge 20.

The system controller 11 controls the overall operation of the apparatus in response to a command signal from a control and display panel 45. Control signals from the system controller 11 are applied to synchronizing signal generating circuit 43, image pick-up section 30, analog-digital converting and signal processing circuit 12, a code generating circuit 42, and a code checking circuit 41. The system controller 11 is also adapted to monitor the status of each of the components of the apparatus.

The system controller 11 also functions to control primarily the writing of data in the memory 21 of memory cartridge 20 and has its bus, which is for transmitting a write address, write-enable signal, chip-select signal, clock and the like, connect to the connector 17.

After loading of the memory cartridge 20 in camera 10 has been sensed by a connection sensing circuit 60, power is supplied from a power supply circuit 50 to operate the system controller 11.

The system controller 11 is advantageously constructed as a processing system to which a memory 44 for storing e.g. various data and programs is connected by a bus. The memory 44 also holds information relating to the type of image pick-up device 35 used by the apparatus, such as information relating to the number of pixels of the image pick-up cell array 34, and information relating to the array of color segments in the color filter. For example, the information relating to the number of pixels of the image pick-up cell array 34 may be in the form of data representing the number of horizontal pixels and the value of the number of horizontal scanning lines, or may be in the form of a code specifying the type of array. The information relating to the array of color segments of the color filter can advantageously be in the form of a code specifying the type of array.

The code generating circuit 42 is a coding circuit which generates a signal representing a code corresponding to the command from the system controller 11. The latter provides the code generating circuit 42 with a command relating to the number of pixels of the image pick-up cell array 34, and a command relating to the array of color filter segments. The output of the code generating circuit 42 is connected to the changeover switch circuit 48 (terminal b). The changeover switch circuit 48 is a selector circuit which, under the control of the system controller 11, selects one of its connection positions (terminals a, b, c) so that the data bus connected to the memory 21 will be connected to one of the circuits 12, 41, 42.

The synchronizing signal generating circuit 43 is controlled by the system controller 11 and provides the image pick-up device 35 with drive signals such as clock and address signals for driving the image pick-up device 35 so that the latter will output a video signal.

The control and display panel 45 has a shutter release button and various manually operated buttons for automatic/manual settings, photometer setting, white balance adjustment and the like. The panel 45 is manipulated by the operator to input commands to the apparatus, these commands being applied to the system controller 11. The panel 45 also has a display function in which signals indicative of the status of the apparatus are received from the system controller 11 and displayed for the operator to see.

The power supply circuit 50 supplies electric power to the various functional portions of the electronic still video camera 10 and is placed in a state capable of performing this operation in response to a signal from the connection sensing circuit 60 indicating that a connection between the memory cartridge 20 and the camera 10 has been sensed. The supply of power from the power supply circuit 50 to the system controller 11 and other functional portions is turned on and off by a power switch 49 manually operated by the operator. Accordingly, when the connection sensing circuit 60 issues a signal indicating that the aforementioned connection has been sensed and, moreover, the power switch 49 is turned on by the operator, power is supplied to the system controller 11 and the other functional elements so that the controller and functional portions begin operating. As long as the signal indicative of connection is not received from the connection sensing circuit 60, the power supply circuit 50 will not deliver power to these functional portions and, hence, the electronic still video camera 10 will not perform a photographic operation, even if the power switch 49 is turned on, as will be described in further detail below. In FIG. 5, the power supply lines for supplying power from the power supply circuit 50 to the functional portions are deleted. The system controller 11 may have a supplemental battery which causes the controller to be standby mode.

The connection sensing circuit 60 is for sensing that the memory cartridge 20 has been connected to the camera 10 by the connector portion 18 included in connector 17. When connection is sensed, the circuit 60 outputs a signal to this effect to the power supply circuit 50.

Figure 6:
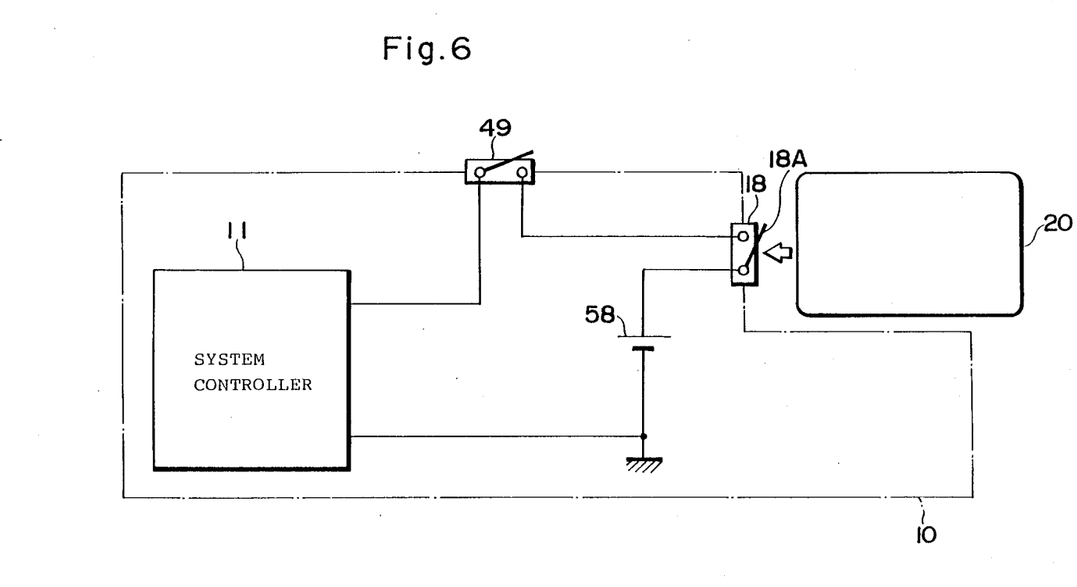
FIG. 6 is a circuit diagram illustrating a specific example of a connection sensing circuit included in the arrangement of FIG. 5.

A specific example of the connection sensing circuit 60 is illustrated in FIG. 6.

As shown in FIG. 6, one line for supplying power to the system controller 11 is connected to the negative electrode of a power supply 58 and to ground. Another line is connected to the positive electrode of the power supply 58 via the power switch 49 and connector 18. When the memory cartridge 20 is loaded in the camera 10, a switch contactor 18A of connector 18 is pressed in such a manner that two terminals 18a, 18b (which correspond to terminals 14a, 14b in FIG. 3) of the connector 18 are connected to each other.

By virtue of this circuitry, the two terminals 18a, 18b of the connector 18 are connected together as a result of the memory cartridge 20 being loaded in the camera 10, so that the effect is the same as that produced by the limit switch 16. By the operator's turning on the power switch 49, the power supply delivers electric power to the system controller 11 to initiate the operation of the same.

Since the two terminals 18a, 18b of connector 18 will not be connected when the memory cartridge 20 has not been loaded in the camera 10, power from the power supply 58 will not be delivered to the system controller 11 even if the operator turns on the power switch 49. The system controller 11 is in just its standby state.

Figure 7:
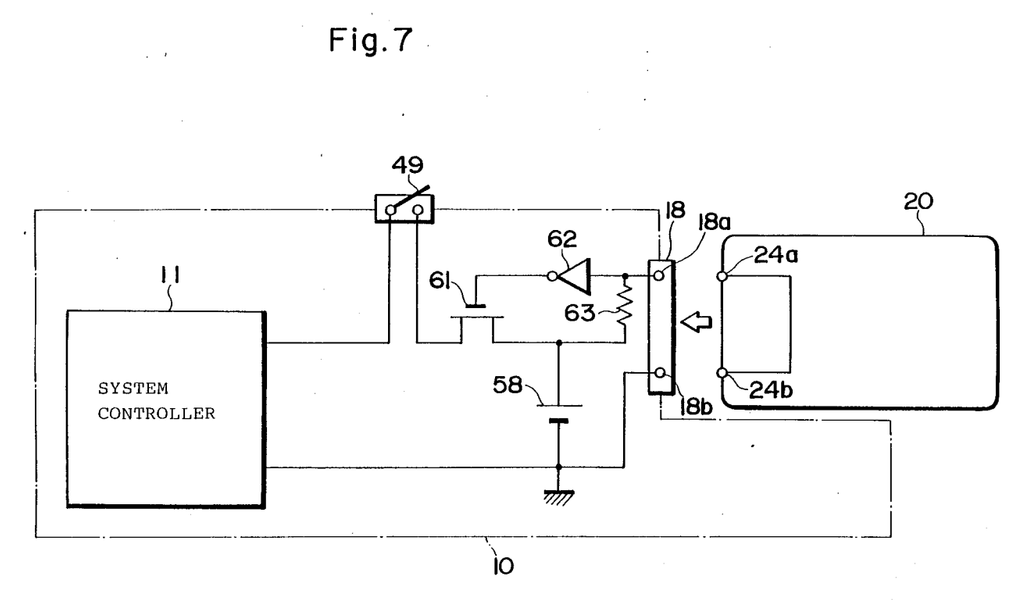
FIG. 7 is a circuit diagram illustrating another example of the connection sensing circuit.

Another example of the connection sensing circuit 60 is illustrated in FIG. 7.

In the example of this circuit also one line for supplying power to the system controller 11 is grounded and the other line for supplying power is connected to one terminal of the power switch 49. The other terminal of the power switch 49 is connected to the drain of a field-effect transistor (FET) 61. The source of FET 61 is connected to the positive electrode of the power supply 58 and to one terminal 18a of the connector 18, the latter via a resistor 63. The gate of FET 61 is connected to the one terminal 18a of connector 18 via an inverter 62. The negative terminal of the power supply 58 is connected to ground. The memory cartridge 20 has two terminals 24a, 24b that are to be connected to the terminals 18a, 18b, respectively. The terminals 24a, 24b are connected together.

In the circuit of FIG. 7, the two shorted terminals 24a, 24b of memory cartridge 20 are connected to the two terminals 18a, 18b of connector 18 when the memory cartridge 20 is loaded in the camera 10. Since this causes the two terminals 18a, 18b of connector 18 to be shorted together, the ground level is applied to the inverter 62, so that a high-level voltage is impressed upon the gate of FET 61. A current therefore flows across the source and drain of FET 61. Accordingly, in response to closure of the power switch 49 by the operator, power from the power supply 58 passes through the FET 61 and is supplied to the system controller 11.

The two terminals 18a, 18b of connector 18 are open when the memory cartridge 20 is not loaded in the camera 10. Therefore, a positive voltage from the power supply 58 is inputted to the inverter 62 through the resistor 63, and a low-level voltage is impressed upon the gate of the FET 61. As a result, the source and drain of the FET 61 are cut off from each other. Therefore, power from the power supply 58 will not be delivered to the system controller 11 even if the operator closes the power switch 49.

Thus, in accordance with the circuit of this example, power from the power supply 58 will be supplied to the system controller 11 by the operator's turning on the power switch 49 provided that the memory cartridge 20 has been loaded in the camera 10.

The operation of the apparatus will now be described with reference to FIG. 5.

When the memory cartridge 20 is loaded in the camera 10 by the connectors 17, 18, loading of the memory cartridge 20 is sensed by the connection sensing circuit 60 via the connector portion 18. Since the power supply circuit 50 is thus rendered connectable to the system controller 11, power from the power supply circuit 50 is delivered to the system controller 11 when the operator turns on the power switch 49.

The system controller 11 causes the changeover switch circuit 48 to be connected to the code generating circuit 42 (terminal b) and provides the code generating circuit 42 with a signal instructing this circuit to generating a checking code. The code generating circuit 42 responds by generating a one-bit checking code signal. This signal is delivered to the memory 21 via the changeover switch circuit 48, connector 17 and data bus and is stored at a predetermined address of the memory 21.

Next, the system controller 11 connects the changeover switch circuit 48 to the code checking circuit 41 (terminal c) and transmits a signal, which is indicative of the address at which the checking code has been stored, as well as a control signal instructing a read operation, to the memory 21 through the connector 17 and the address and control buses, thereby causing the checking code to be read out of the memory 21. The checking code thus read is inputted to the code checking circuit 41 through the connector 17 and switch 48. The code checking circuit 41 checks to determine whether this code is identical with the code generated by the code generating circuit 42.

Upon confirming that the two codes are identical, the code checking circuit 41 sends the system controller 11 a signal indicative of the end of the checking operation. The system controller 11 responds to this signal by again connecting the changeover switch circuit 48 to the code generating circuit 42, causing the code generating circuit 42 to generate codes indicative of information relating to the number of pixels of the image pick-up cell array 34, namely pixel number information, information relating to the array of color filter segments, namely color separation information, and other information necessary at the time of playback, and causing these codes to be stored in the memory 21.

After the codes indicative of the information needed for playback are stored in the memory 21, the system controller 11 supplies the various components of camera 10 with power from the power supply circuit 50. This makes it possible for the operator to actuate the shutter 33 by pressing the shutter release button.

The operator takes a picture of a subject by manipulating the control and display panel 45. Pressing the shutter release button opens the shutter 33 so that one frame of the picture of the subject is picked up by the image pick-up device 35. In accordance with the clock provided by the synchronizing signal generating circuit 43, the image pick-up device outputs the picture in the form of a dot sequential video signal. At this time the system controller 11 connects the changeover switch circuit 48 to the processing circuit 12 (terminal a) in advance.

The dot sequential video signal is converted into the corresponding digital data by the analog-digital converting and signal processing circuit 12 before being outputted to the connector 17 through the changeover switch circuit 48.

Along with the digital video signal, the system controller 11 delivers such control signals as a write address, write-enable signal, chip-select signal and clock signal to the memory 21. In synchronization with this, the digital video signal inputted through the connector 17 is sequentially written in successive storage locations of the memory 21. Thus, video signal data consisting of a picture of one frame are stored in a storage area of the memory 21.

Figure 8:
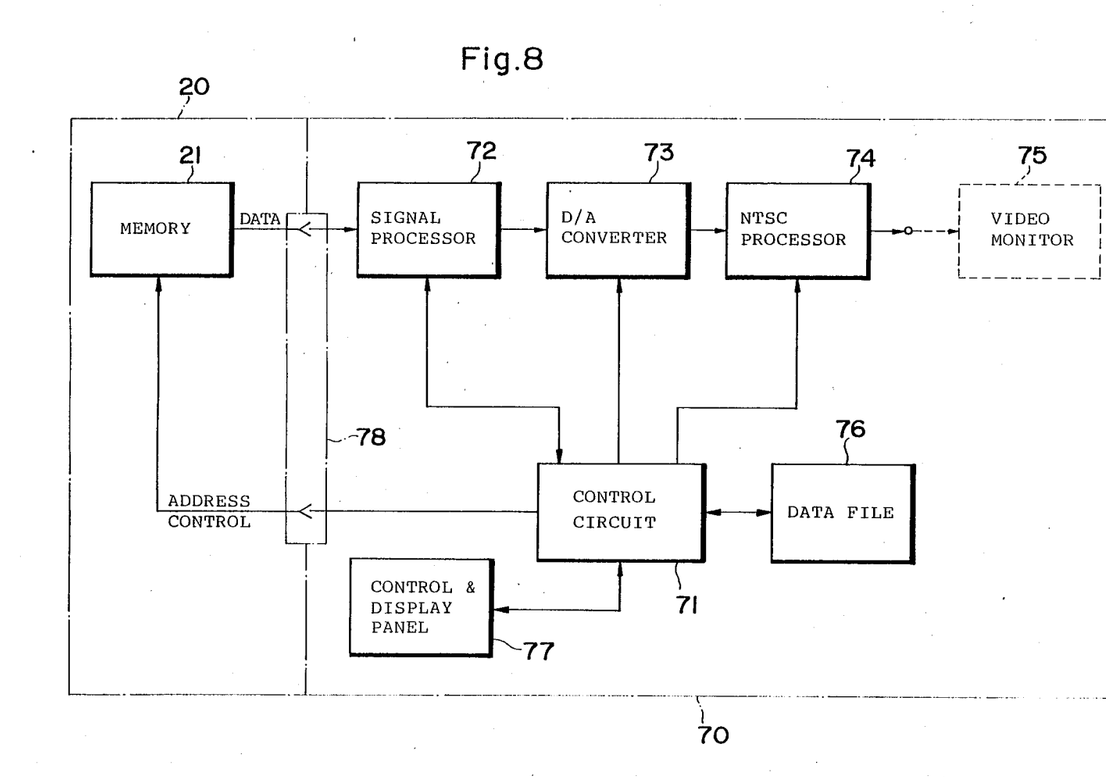
FIG. 8 is a functional block diagram illustrating an exemplary arrangement of a playback apparatus which plays back a video signal stored in a memory by the camera embodied in FIG. 5.

The video signal stored in memory 21 in the apparatus of the present embodiment is played back by a playback apparatus 70 having a construction of the type exemplified in FIG. 8. The playback apparatus 70 has a connector 78 to which the memory cartridge 20 is connected in attachable/detachable fashion and which serves to connect a read-out data bus of the cartridge 20 to a signal processing circuit 72. Address and control buses of the memory cartridge 20 are connected to a control circuit 71 via the connector 78.

The signal processing circuit 72 subjects the input digital video signal to color separation and to the necessary video signal processing, such as white-balance adjustment and tone ($\tau$) correction. The result of this processing is outputted to a digital-analog converter (DAC) 73. Data needed in order to perform this video signal processing suitably, such as pixel number information regarding the image pick-up device 35 and color separation information, both of which are for the purpose of performing color separation, are set in the signal processing circuit 72 from the control circuit 71, with the signal processing circuit 72 executing the video signal processing on the basis of the set information.

The aforementioned digital-analog converter 73 converts the output video signal of signal processing circuit 72 into the corresponding analog signal and delivers the analog signal to an NTSC processing circuit 74. The latter includes a matrix and encoder for forming this analog signal into a luminance signal and color difference signal and for converting these signals, along with a synchronizing signal from the control circuit 71, into an NTSC composite video signal outputted to a picture output unit, such as a video monitor 75 and/or printer, by way of example. The monitor 75 outputs the composite video signal as a visible picture.

The elements of the playback apparatus 70 are controlled by the control circuit 71. The latter is advantageously constructed as a processing system to which a control and display panel 77 and a data file 76 are connected. The control and display panel 77 has a playback button and various manually operated buttons such as a frame designating button, white balance adjusting button, tone adjusting button and the like. The panel 77 is manipulated by the operator to input commands to the apparatus, these commands being applied to the control circuit 71. The panel 77 also has a display function in which signals indicative of the status of the apparatus are received from the control circuit 71 and displayed for the operator to see.

The data file 76 is a memory device which holds various data necessary for the operation of the control circuit 71 and is constituted by a ROM, by way of example. The data held in the data file 76 contains pixel number information and color separation information of the image pick-up device 35 with regard to the video signal stored in the memory 21 of memory cartridge 20.

In response to an instruction inputted by the operator at the control and display panel 77, the control circuit 71 supplies the control bus of the memory 21 with a control signal, which is for reading data out of the memory 21, in accordance with a predetermined basic frequency. Thus, video signal data of a designated frame, as well as the pixel number information and color separation information of the image pick-up device 35, are read out to the signal processing circuit 72 from the memory 21.

Codes indicating the pixel number information and color separation information are accepted by the control circuit 71 from the signal processing circuit 72. The control circuit 71 retrieves the data file 76 in accordance with these codes, searches for the pixel number data and color separation data and outputs the same. In accordance with the retrieved and outputted data, the control circuit 71 decides the rate of the control signals, such as the clock signal, that are to be supplied to the signal processing circuit 72 and digital-analog converter 73. Furthermore, data necessary for the video signal processing to be performed appropriately, such as the pixel number information and color separation information of the image pick-up device 35 for performing color separation, are set in the signal processing circuit 72 in accordance with the rate decided.

The control circuit 71 thus reads the video signal of the designated frame out of the memory 21 and inputs this signal to the signal processing circuit 72. The latter separates the inputted dot sequential video signal into color signals, e.g. red (R), green (G) and blue (B), in accordance with the pixel clock provided by the control circuit 71. This color separation is carried out in accordance with the pixel number information and color separation information that has been set in the signal processing circuit, namely in dependence upon the number of pixels and the color filter segment array of the image pick-up cell array 34 of image pick-up device 35 used in the camera 10. Accordingly, the playback apparatus 70 is capable of coping with the pixel array and color filter segment array of any system.

The signal processing circuit 72 also corrects a shift in white color balance caused by the color temperature of the light source when imaging is performed by the image pick-up device 35, and corrects a shift in tone caused by a non-linear characteristic of the image pick-up device 35. The video signal data outputted by the signal processing circuit 72 is converted into an analog signal by the digital-analog converter 73, a luminance signal and color difference signal are obtained by the NTSC processing circuit 74, and the output of circuit 74 is delivered as an NTSC composite video signal. Finally, the signal is played back as a visible picture by the video monitor 75 and/or printer.

In this embodiment, the processing circuit 74 processes signals in an NTSC system. However, it goes without saying that an arrangement can be adopted in which the processing circuit 74 processes not only signals in an NTSC system but also in a PAL system or other standard television signal system, such as SECAM.

Thus, in accordance with the present embodiment, the arrangement is such that power from the power supply circuit 50 is delivered to the system controller 11 by the operator closing the power switch 49 after loading of the memory cartridge 20 has been sensed by the connection sensing circuit 60. Accordingly, if loading of the memory cartridge 20 is not sensed, power will not be supplied from the power supply circuit 50 even if the operator closes the power switch 49. Accordingly, a picture cannot be taken as long as the memory cartridge 20 is incorrectly loaded. This makes it possible to avoid the problem that occurs in the prior art, namely a situation in which, when the memory cartridge 20 is incorrectly loaded, the operator shoots pictures is spite of this fact, with the result that the resulting picture cannot be stored in the memory 21 of the memory cartridge 20.

Furthermore, in accordance with the embodiment, when the loading of the memory cartridge 20 has been verified, first the code generating circuit 42 generates information necessary for playback, such as color separation information, this information is written in the memory 21, and triggering of the shutter 33 by the shutter release button is enabled after the writing operation ends. Since a photographic operation is thus made possible only after the information necessary for playback is written in memory 21 beforehand, it is possible to prevent this information from not being stored in the memory 21. In addition, since the color separation information, etc., is written in memory 21 in advance, the burden of controlling writing operations can be eliminated with regard to the system controller 11. For example, the burden on the system controller 11 would be great if the color separation information were to be written in memory 21 in e.g. a blanking interval of the video signal in concurrence with the writing of the video signal in memory 21.

In accordance with the present embodiment, power from the power supply 50 is capable of being supplied to the system controller 11 after loading of the memory cartridge 20 is sensed, and the shutter is capable of being triggered after information such as the color separation information is written in the memory 21. As a result, power is not supplied prior to correct loading of the memory cartridge 20, and the power necessary for photography is not supplied before photography is possible. This makes it possible to prevent a drop in the capacity of the power supply due to wasteful consumption of power.

As many apparently widely different embodiments of the present invention can be made without departing from the spirit and scope thereof, it is to be understood that the invention is not limited to the specific embodiments thereof except as defined in the appended claims.

What is claimed is:

1. A device for checking coupling of a memory cartridge, comprising:
   a memory cartridge having a memory and a plurality of first terminals; and
   an electronic device having a plurality of second terminals wherein when said memory cartridge is loaded in said electronic device, said electronic device is capable of being coupled with said memory cartridge through the plurality of first and second terminals;
   said memory cartridge including checking code generating means for generating a checking code, and further including changeover means for selectively connecting the plurality of first terminals to the memory or the checking code generating means;
   one of said memory cartridge and said electronic device being provided with means for sensing that said memory cartridge has been loaded in said electronic device at a predetermined location thereof, and control means for controlling said changeover means in such a manner that said checking code generating means is connected to said plurality of first terminals when loading of said memory cartridge in said electronic device has been sensed;

said electronic device including means for determining whether coupling with said memory cartridge through each of the plurality of first and second terminals has been achieved by checking the checking code transmitted via the plurality of first and second terminals from said checking code generating means with a stored code corresponding to said checking code.

2. The device according to claim 1, wherein said electronic device is an electronic still video camera in which a photographic operation is enabled when it is determined that coupling of said plurality of first and second terminals is in a normal state.

3. A device for checking coupling between an electronic device for recording and/or playing back a still video signal and a memory cartridge including a memory having a first storage area for storing data representing the still video signal and a second storage area for storing a predetermined code, said electronic device having a first connector including a plurality of first terminals for sending or receiving signals including address signals, data signals and control signals, said memory cartridge having a second connector including a plurality of second terminals equivalent in number to said first terminals, wherein when said memory cartridge is loaded in said electronic device, said memory cartridge and electronic device are coupled with each other through said first and second connectors, said coupling checking device comprising;

first sensing means for sensing that said memory cartridge has been loaded at a prescribed location in said electronic device;

writing means, provided in said electronic device, for designating an address of said second storage area in the memory of said memory cartridge and writing the predetermined code at the designated address of said second storage area whereby all of the respective first and second terminals of said first and second connectors are utilized, said designating and writing occurring subsequent the loading of said memory cartridge sensed by said first sensing means;

reading means, provided in said electronic device, for reading the code written in said second storage area of said memory of said memory cartridge whereby all of the respective first and second terminals of said first and second connectors are utilized; and second sensing means, provided in said electronic device, for sensing coincidence between the predetermined code written by said writing means and the code read by said reading means to check whether said first and second connectors are in good connection.

4. The device according to claim 3, further comprising means for outputting a warning signal when coincidence fails to be sensed.

5. The device according to claim 3, further comprising means for controlling said writing, reading and coincidence sensing processing in such a manner that said processing is executed a number of times changing at least one of the address and code each time.

6. The device according to claim 3, wherein said electronic device is an electronic still video camera in which photographic processing is enabled when coincidence of the codes is sensed.

7. A system for checking coupling between a plurality of first terminals of an electronic device and a corresponding plurality of second terminals of a memory cartridge means comprising:

first sensing means for sensing that the memory cartridge means has been loaded at a predetermined location in the electronic device and for providing a signal indicative of loading;

writing means for designating a predetermined address in said memory cartridge means and for writing a predetermined code at the predetermined address in response to the signal indicative of loading;

reading means for reading the code stored at the predetermined address of the memory cartridge means corresponding to said predetermined code;

second sensing means for sensing coincidence between the stored code read from said predetermined address of the memory cartridge means and said predetermined code; and warning signal means for outputting a warning signal in response to the lack of a sensed coincidence by said second sensing means indicating that any one of the corresponding plurality of first and second terminals are not coupled.

* * * * *